United States Patent
Kang et al.

(10) Patent No.: US 9,912,311 B2
(45) Date of Patent: Mar. 6, 2018

(54) MULTIMODE RECONFIGURABLE AMPLIFIER AND ANALOG FILTER INCLUDING THE SAME

(71) Applicant: Samsung Electronics Co., Ltd., Gyeonggi-do (KR)

(72) Inventors: So-Young Kang, Gyeonggi-do (KR); Thomas Byung-Hak Cho, Gyeonggi-do (KR); Hee-Seon Shin, Seoul (KR); Su-Seob Ahn, Gyeonggi-do (KR); Jong-Mi Lee, Gyeongsangbuk-do (KR); Min-Gyu Jo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/164,389

(22) Filed: May 25, 2016

(65) Prior Publication Data

US 2017/0026030 A1  Jan. 26, 2017

(30) Foreign Application Priority Data

Jul. 22, 2015 (KR) .......... 10-2015-0103861
Jul. 29, 2015 (KR) .......... 10-2015-0107229
Sep. 24, 2015 (KR) .......... 10-2015-0135531

(51) Int. Cl.
*H03F 3/45* (2006.01)
*H03K 5/00* (2006.01)
(Continued)

(52) U.S. Cl.
CPC ............ *H03G 1/0029* (2013.01); *H03F 1/14* (2013.01); *H03F 3/4521* (2013.01); *H03F 3/45183* (2013.01); *H03F 3/45475* (2013.01);
*H03F 3/45659* (2013.01); *H03F 3/72* (2013.01); *H03G 1/0088* (2013.01); *H03G 3/001* (2013.01); *H03G 5/28* (2013.01);
(Continued)

(58) Field of Classification Search
CPC ... H03H 11/1213; H03F 1/14; H03F 3/45183; H03F 3/4575; H03F 3/72; H03G 1/0029
USPC ............ 327/552–561; 330/308, 278.51, 151, 330/254, 260, 258
See application file for complete search history.

(56) References Cited

U.S. PATENT DOCUMENTS 5,155,447 A  10/1992  Huijsing et al.
6,300,816 B1 * 10/2001  Nguyen ................ G11C 7/062
                                              327/205

(Continued)

FOREIGN PATENT DOCUMENTS

JP  2015-033083  2/2015
KR  10-0613428   2/2006
(Continued)

*Primary Examiner* — Dinh T Le
(74) *Attorney, Agent, or Firm* — The Farrell Law Firm, P.C.

(57) ABSTRACT

Provided is a reconfigurable amplifier. The reconfigurable amplifier includes a gain circuit including a gain path configured to amplify an input signal, and a feed forward circuit including a feed forward path configured to receive the input signal and perform feed forward compensation on the input signal, and a first control circuit configured to perform the feed forward compensation in a first mode by activating the feed forward path, and deactivate the feed forward path in a second mode different from the first mode.

16 Claims, 20 Drawing Sheets

(51) Int. Cl.
    *H03G 1/00*     (2006.01)
    *H03F 1/14*     (2006.01)
    *H03F 3/72*     (2006.01)
    *H03G 3/00*     (2006.01)
    *H03G 5/28*     (2006.01)
    *H03H 11/12*     (2006.01)

(52) U.S. Cl.
    CPC .. *H03F 2200/153* (2013.01); *H03F 2200/411* (2013.01); *H03F 2203/45522* (2013.01); *H03F 2203/45526* (2013.01); *H03F 2203/45591* (2013.01); *H03H 11/126* (2013.01); *H03H 11/1256* (2013.01)

(56) References Cited

U.S. PATENT DOCUMENTS

| | | | |
|---|---|---|---|
| 6,392,481 B1 | 5/2002 | Kurttio | |
| 6,573,790 B2 | 6/2003 | Steensgaard-Madsen | |
| 6,573,791 B2 | 6/2003 | Sridhar | |
| 6,989,716 B2 | 1/2006 | Kwon et al. | |
| 7,403,070 B2 | 7/2008 | Suzuki et al. | |
| 7,466,205 B1 | 12/2008 | Lin et al. | |
| 7,911,269 B2 * | 3/2011 | Yang | H03F 1/3205 330/124 R |
| 8,604,879 B2 | 12/2013 | Mourant et al. | |
| 2003/0122621 A1 | 7/2003 | Sidiropoulos et al. | |
| 2006/0121873 A1 * | 6/2006 | Ammar | G01K 11/006 455/326 |
| 2014/0266433 A1 * | 9/2014 | Nobbe | H03F 1/30 330/151 |

FOREIGN PATENT DOCUMENTS

| | | |
|---|---|---|
| KR | 10-0652207 | 11/2006 |
| KR | 10-2009-0047619 | 5/2009 |
| KR | 10-1038854 | 5/2011 |

* cited by examiner ued to amplify an output of the first amplifier, and a feed forward circuit and a control circuit connected to an input terminal of the first amplifier and an output terminal of the second amplifier and configured to perform feed forward compensation, wherein the control circuit is further configured to perform feed forward compensation in a first mode using m first transistors and perform feed forward compensation in a second mode different from the first mode using n first transistors, wherein m is an integer greater than or equal to one, and n is an integer of greater than or equal to zero and less than m.

According to another aspect of the present disclosure, there is provided an analog filter. The analog filter includes a reconfigurable amplifier having an input terminal configured to receive an input signal; and a variable resistor connected to the input terminal, wherein the reconfigurable amplifier is configured to operate as a feed forward compensation amplifier when the variable resistor has a first resistance value and operate as a Miller compensation amplifier when the variable resistor has a second resistance value different from the first resistance value.

MULTIMODE RECONFIGURABLE AMPLIFIER AND ANALOG FILTER INCLUDING THE SAME

PRIORITY

This application claims priority under 35 U.S.C. § 119(a) to a Korean Patent Application filed on Jul. 22, 2015 in the Korean Intellectual Property Office and assigned Serial No. 10-2015-0103861, a Korean Patent Application filed on Jul. 29, 2015 in the Korean Intellectual Property Office and assigned Serial No. 10-2015-0107229, and a Korean Patent Application filed on Sep. 24, 2015 in the Korean Intellectual Property Office and assigned Serial No. 10-2015-0135531, the entire contents of each of which are incorporated herein by reference.

BACKGROUND

1. Technical Field

The present disclosure relates generally to a multimode reconfigurable amplifier and an analog filter including the same, and more particularly, to a multimode reconfigurable amplifier which changes a compensation method according to a bandwidth of a supported band of an operating mode and an analog filter including the same.

2. Description of the Related Art

The development of wireless communication systems is increasing the need to rapidly process signals in various frequency bands. In line with this trend, there is a growing demand for the development of a reconfigurable broadband multi-communication terminal system that is efficiently compatible with frequency bands used in conventional communication systems and can satisfy next-generation wireless communication standards.

SUMMARY

An aspect of the present disclosure provides a reconfigurable amplifier having improved operational performance and stability by applying a different compensation method according to a bandwidth of a supported band of an operating mode.

Another aspect of the present disclosure provides an analog filter which can stably filter operations in various frequency bands without a reduction in performance.

According to an aspect of the present disclosure, there is provided a reconfigurable amplifier. The reconfigurable amplifier includes a gain circuit comprising a gain path configured to amplify an input signal, and a feed forward circuit including a feed forward path configured to receive the input signal and perform feed forward compensation on the input signal, and a first control circuit configured to perform the feed forward compensation in a first mode by activating the feed forward path, and deactivating the feed forward path in a second mode different from the first mode.

According to another aspect of the present disclosure, there is provided a reconfigurable amplifier. The reconfigurable amplifier includes a gain circuit including a first amplifier configured to amplify an input signal and a second amplifier configured to amplify an output of the first amplifier, a feed forward circuit connected to an input terminal of the first amplifier and an output terminal of the second amplifier and configured to perform feed forward compensation, a common feedback amplifier, and a control circuit configured to control the gain circuit to have a first capacitance configuration in a first mode and control the gain circuit to have a second capacitance configuration, which is different from the first capacitance configuration, in a second mode different from the first mode.

According to another aspect of the present disclosure, there is provided a reconfigurable amplifier. The reconfigurable amplifier includes a gain circuit including a first amplifier configured to amplify an input signal and a second amplifier config-

BRIEF DESCRIPTION OF THE DRAWINGS

The above and other aspects, features, and advantages of the present disclosure will become more apparent from the following description, taken in conjunction with the accompanying drawings, in which.

DETAILED DESCRIPTION OF EMBODIMENTS OF THE PRESENT DISCLOSURE

The present disclosure is described more fully hereinafter with reference to the accompanying drawings, in which embodiments of the present disclosure are shown. The present disclosure may, however, be embodied in different forms and is not intended to be construed as limited to the embodiments set forth herein. Rather, these embodiments are provided so that this disclosure will be thorough and complete, and will fully convey the scope of the present disclosure to those skilled in the art. Same reference numbers indicate the same components throughout the present disclosure. In the accompanying drawings, the thicknesses of layers and regions are exaggerated for clarity.

The terms "a," "an," "the" and similar referents in the context of describing the present disclosure (especially in the context of the appended claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all terms used herein have the same meanings as commonly understood by one of ordinary skill in the art to which the present disclosure belongs. It is noted that the use of any and all examples, or exemplary terms provided herein is intended merely to better illuminate the present disclosure and is not intended to be a limitation on the scope of the present disclosure unless otherwise specified. Further, unless defined otherwise, all terms defined in generally used dictionaries are not intended to be overly interpreted.

The present disclosure will be described with reference to perspective views, cross-sectional views, and/or plan views, in which preferred embodiments of the present disclosure are shown. Thus, the profile of a view may be modified according to manufacturing techniques and/or allowances. That is, the embodiments of the present disclosure are not intended to limit the scope of the present disclosure but are intended to cover all changes and modifications that may be caused due to a change in manufacturing process. Thus, regions shown in the accompanying drawings are illustrated in schematic form and the shapes of the regions are presented simply by way of illustration and not as a limitation.

Figure 1:
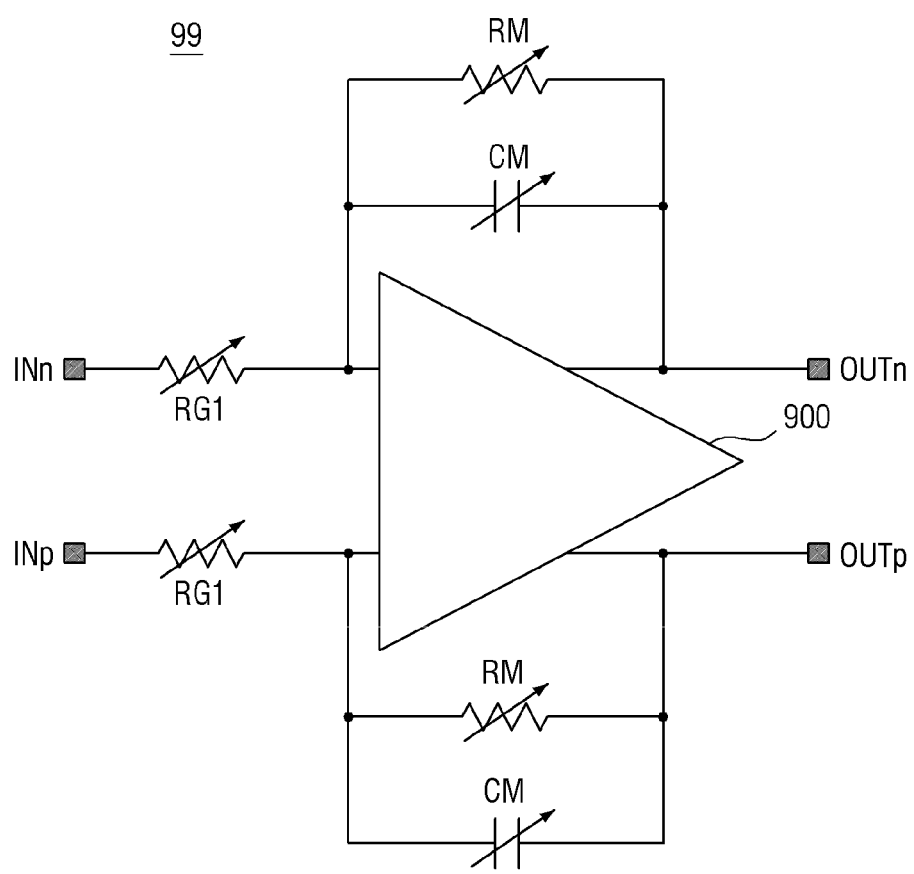
FIG. 1 is a circuit diagram of an analog filter.

FIG. 1 is a circuit diagram of an analog filter 99.

Referring to FIG. 1, the analog filter 99 may include an amplifier 900 which receives input signals INn and INp through input resistors RG1 and feedback resistors RM and feedback capacitors CM which are connected in parallel to an input terminal and an output terminal of the amplifier 900, respectively. The input signals INn and INp provided to the amplifier 900 may be amplified and then output as output signals OUTn and OUTp, respectively. The input signals INn and INp may be, but are not limited to, differential signals.

Each of the input resistors RG1 and the feedback resistors RM may include, for example, a variable resistor. A gain and cutoff frequency of the analog filter 99 can be changed by varying resistance levels of the input resistors RG1 and the feedback resistors RM.

The cutoff frequency of the analog filter 99 may be inversely proportional to the resistance levels of the feedback resistors RM.

That is, when the resistance levels of the feedback resistors RM increase, the cutoff frequency of the analog filter 99 may decrease. Therefore, the analog filter 99 may operate as a narrowband filter that passes an input signal having a low frequency.

In addition, when the resistance levels of the feedback resistors RM decrease, the cutoff frequency of the analog filter 99 may increase. Therefore, the analog filter 99 may operate as a wideband filter that passes an input signal having a high frequency.

Furthermore, when the resistance levels of the feedback resistors RM are maintained in a certain range, the analog filter 99 may operate as a middleband or bandpass filter that passes an input signal having a frequency between a first frequency and a second frequency.

The feedback resistors RM and the feedback capacitors CM may be controlled by, e.g., a digital code to increase or decrease linearly or exponentially.

The analog filter 99 may include a passive device, which includes the input resistors RG1, the feedback resistors RM and the feedback capacitors CM, and the amplifier 900. The performance of the analog filter 99 may be greatly affected by the amplifier 900.

The amplifier 900 may be a two-stage amplifier that obtains a desired gain using two amplifiers. The two-stage amplifier is described below in greater detail with reference to FIGS. 2 and 3.

Figure 2:
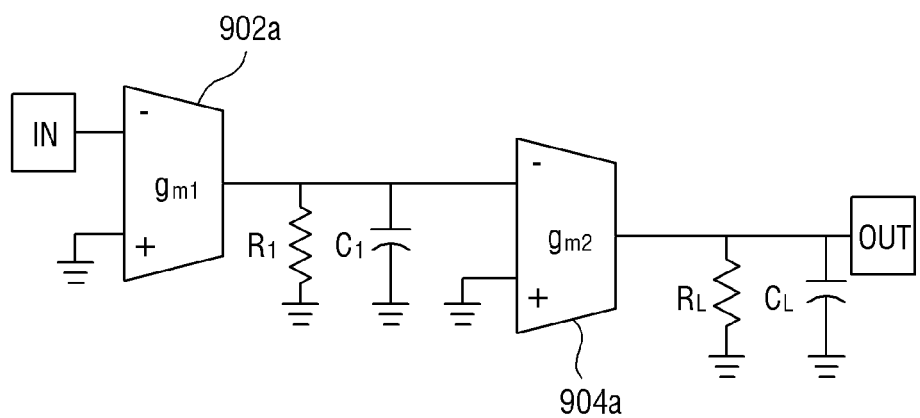
FIG. 2 is a circuit diagram of an amplifier of FIG. 1.
Figure 3:
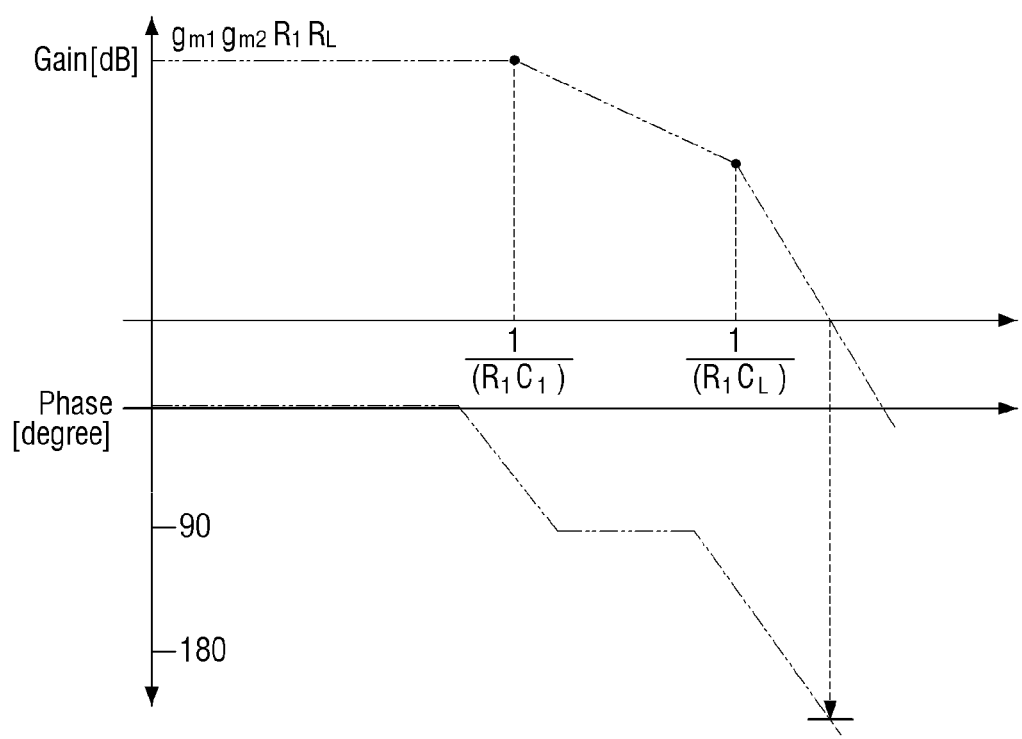
FIG. 3 is a diagram illustrating frequency characteristics of the amplifier of FIG. 2.

FIG. 2 is a circuit diagram of the amplifier 900 of FIG. 1. FIG. 3 is a diagram illustrating frequency characteristics of an amplifier 900a of FIG. 2.

FIGS. 2 and 3 are diagrams illustrating the equivalent circuit diagram and frequency characteristics of the amplifier 900 of FIG. 1 if the amplifier 900 is configured as the two-stage amplifier 900a.

Referring to FIG. 2, the two-stage amplifier 900a may include a first amplifier 902a which amplifies an input signal and a second amplifier 904a which amplifies an output of the first amplifier 902a.

Referring to FIG. 3, the two-stage amplifier 900a may have two poles in its frequency characteristics. The two poles may reduce the phase of the two-stage amplifier 900a, thus making the operation of the two-stage amplifier 900a unstable.

To resolve an operational instability issue, a two-stage amplifier employing a Miller compensation method may be used. A two-stage amplifier employing the Miller compensation method is described below in greater detail with reference to FIGS. 4 and 5.

Figure 4:
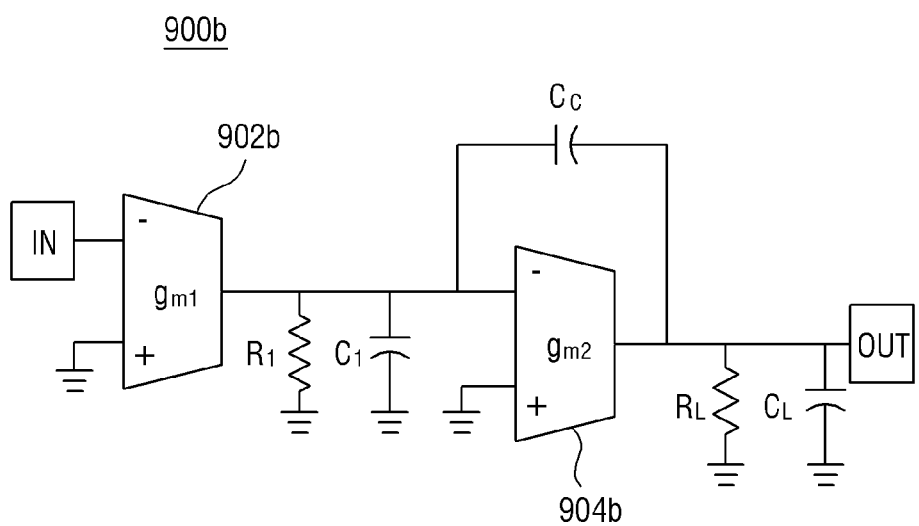
FIG. 4 is a circuit diagram of the amplifier of FIG. 1.
Figure 5:
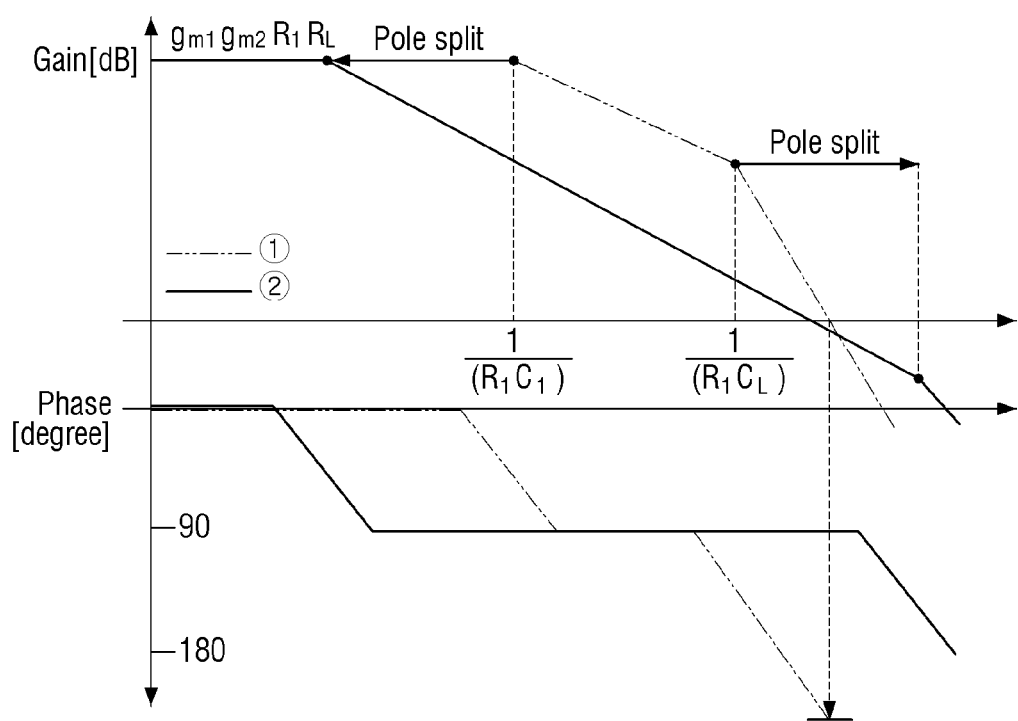
FIG. 5 is a diagram illustrating frequency characteristics of the amplifier of FIG. 2 and the amplifier of FIG. 4.

FIG. 4 is a circuit diagram of the amplifier 900 of FIG. 1. FIG. 5 is a diagram illustrating frequency characteristics of the amplifier 900a of FIG. 2 and an amplifier 900b of FIG. 4.

FIGS. 4 and 5 are a circuit diagram and a diagram illustrating frequency characteristics of the amplifier 900 of FIG. 1 configured as the Miller compensation two-stage amplifier 900b.

Referring to FIG. 4, the Miller compensation two-stage amplifier 900b may include a first amplifier 902b which amplifies an input signal and a second amplifier 904b which amplifies an output of the first amplifier 902b. A Miller capacitor Cc for Miller compensation may be disposed between an input terminal and an output terminal of the second amplifier 904b.

Referring to FIG. 5, a frequency characteristic curve ② of the Miller compensation two-stage amplifier 900b is different from a frequency characteristic curve ① of the two-stage amplifier 900a (see FIG. 2) not employing the Miller compensation method.

Specifically, in the frequency characteristic curve ② of the Miller compensation two-stage amplifier 900b, two poles are split by the Miller capacitor Cc. That is, a first pole is moved to a low frequency band, and a second pole is moved to a high frequency band. Accordingly, the phase of the amplifier 900 of FIG. 1 configured as the Miller compensation two-stage amplifier 900b increases, thereby improving the operational stability of the amplifier 900.

However, referring to the frequency characteristic curve ② of the Miller compensation two-stage amplifier 900b, a gain of the high frequency band becomes significantly lower than that of the low frequency band. Therefore, as an operating frequency of the analog filter 99 increases (that is, when the analog filter 99 operates as a wideband filter), the operating efficiency thereof may be reduced.

To resolve the efficiency issue, a high-performance amplifier having a high gain in the high frequency band should be designed. However, if the Miller compensation method is employed as it is to resolve the efficiency issue, the current consumption of the analog filter 99 (see FIG. 1) becomes too high.

An analog filter according to an embodiment of the present disclosure, which can resolve the above issue, is described below with reference to FIGS. 6 through 12.

Figure 6:
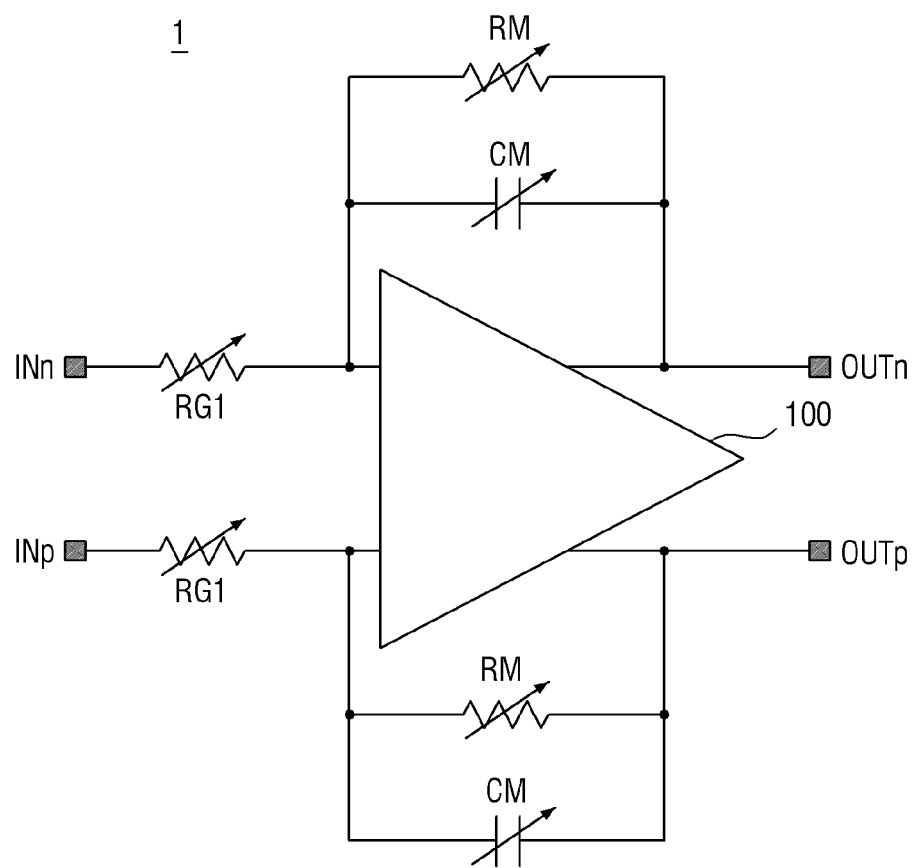
FIG. 6 is a circuit diagram of an analog filter according to an embodiment of the present disclosure.

FIG. 6 is a circuit diagram of an analog filter 1 according to an embodiment of the present disclosure.

Referring to FIG. 6, the analog filter 1 may include a reconfigurable amplifier 100 which receives input signals INn and INp through input resistors RG1 and feedback resistors RM and feedback capacitors CM which are connected in parallel to an input terminal and an output terminal of the reconfigurable amplifier 100, respectively. The input signals INn and INp provided to the reconfigurable amplifier 100 may be amplified differently according to an operating mode of the reconfigurable amplifier 100 and then output as output signals OUTn and OUTp, respectively. The input signals INn and INp may be, but are not limited to, differential signals.

Each of the input resistors RG1 and the feedback resistors RM may include, for example, a variable resistor. A gain and cutoff frequency of the analog filter 1 may be changed by varying resistance levels of the input resistors RG1 and the feedback resistors RM.

The cutoff frequency of the analog filter 1 may be inversely proportional to the resistance levels of the feedback resistors RM.

That is, when the resistance levels of the feedback resistors RM increase, the cutoff frequency of the analog filter 1 may decrease. Therefore, the analog filter 1 may operate as a narrowband filter that passes an input signal having a low frequency. In this case, the reconfigurable amplifier 100 may operate in a narrowband mode.

In addition, when the resistance levels of the feedback resistors RM decrease, the cutoff frequency of the analog filter 1 may increase. Therefore, the analog filter 1 may operate as a wideband filter that passes an input signal having a high frequency. In this case, the reconfigurable amplifier 100 may operate in a wideband mode.

Furthermore, when the resistance levels of the feedback resistors RM are maintained in a certain range, the analog filter 1 may operate as a middleband or bandpass filter that passes an input signal having a frequency between a first frequency and a second frequency. In this case, the reconfigurable amplifier 100 may operate in a middleband mode.

The feedback resistors RM and the feedback capacitors CM may be controlled by, e.g., a digital code to increase or decrease linearly or exponentially.

Figure 7:
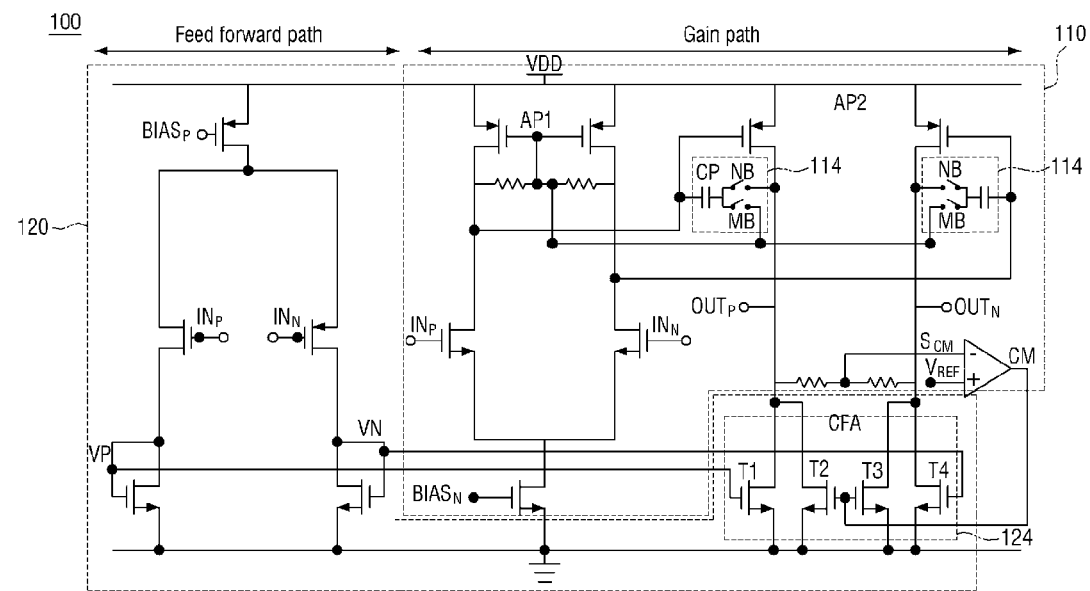
FIG. 7 is a circuit diagram of a reconfigurable amplifier of FIG. 6.
Figure 8:
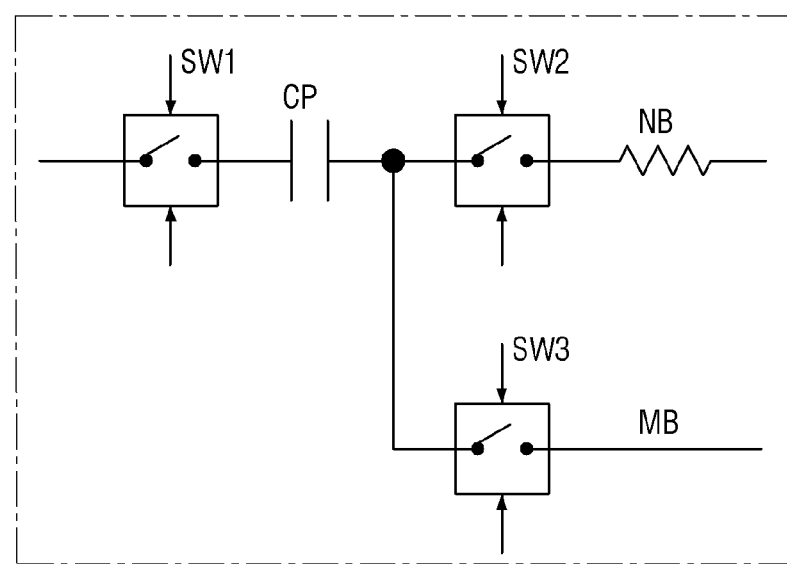
FIG. 8 is a circuit diagram of compensation control circuits of FIG. 7.
Figure 9:
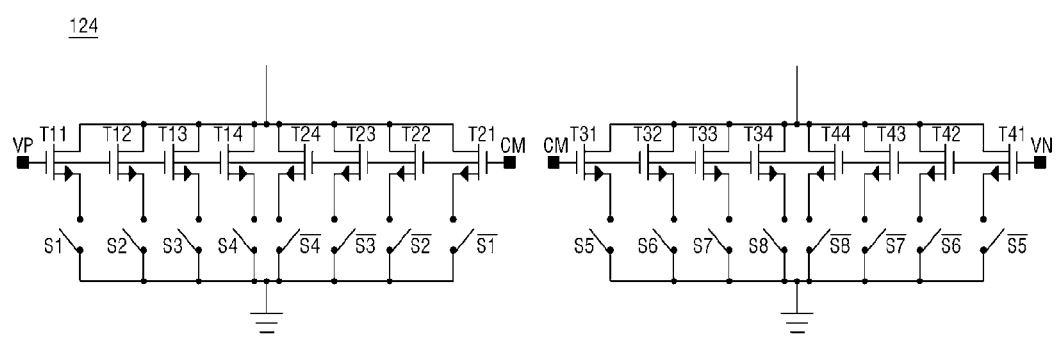
FIG. 9 is a circuit diagram of a feed forward control circuit of FIG. 7.

FIG. 7 is a circuit diagram of the reconfigurable amplifier 100 of FIG. 6. FIG. 8 is a circuit diagram of a (compensation control circuits) 114 of FIG. 7. FIG. 9 is a circuit diagram of a feed forward control circuit 124 illustrated in FIG. 7.

Referring to FIG. 7, the reconfigurable amplifier 100 may include a gain circuit 110 and a feed forward circuit 120.

The gain circuit 110 may include a first amplifier AP1 which amplifies input signals INn and INp and a second amplifier AP2 which amplifies outputs of the first amplifier AP1. That is, the gain circuit 110 according to the current embodiment may include a two-stage amplifier.

As illustrated in the FIG. 7, each of the first amplifier AP1 and the second amplifier AP2 may include a transistor pair. The first amplifier AP1 and the second amplifier AP2 may form a gain path which amplifies the input signals INn and INp and outputs the amplified signals INn and INp as output signals OUTn and OUTp, respectively.

In an embodiment of the present disclosure, the gain circuit 110 may include the gate control circuit 114. The gain control circuit 114 may control a gain path to have a different capacitance configuration according to the operating mode of the reconfigurable amplifier 100.

Specifically, the gain control circuit 114 may control the capacitance configuration of the gain path when the reconfigurable amplifier 100 operates in the wideband mode to be different from the capacitance configuration of the gain path when the reconfigurable amplifier 100 operates in the middleband mode.

In addition, when the reconfigurable amplifier 100 operates in the narrowband mode, the gain control circuit 114 may control the reconfigurable amplifier 100 to operate as a Miller compensation amplifier. This is described in greater detail below.

Referring to FIG. 8, the gain control circuit 114 may include first through third switches SW1 through SW3 and a control capacitor CP and nulling R (one of the Miller compensation parameters).

The first switch SW1 may connect a first terminal of the control capacitor CP between the first amplifier AP1 and the second amplifier AP2. Specifically, when the first switch SW1 is turned on (e.g. closed), the first terminal of the control capacitor CP may be connected between the first amplifier AP1 and the second amplifier AP2. When the first switch SW1 is turned off (e.g. open), the first terminal of the control capacitor CP may not be connected between the first amplifier AP1 and the second amplifier AP2.

The second switch SW2 may connect a second terminal of the control capacitor CP to an output terminal of the second amplifier AP2. Specifically, when the second switch SW2 is turned on, the second terminal of the control capacitor CP may be connected to the output terminal of the second amplifier AP2. When the second switch SW2 is turned off, the second terminal of the control capacitor CP may not be connected to the output terminal of the second amplifier AP2.

The third switch SW3 may connect the second terminal of the control capacitor CP between the first amplifier AP1 and the second amplifier AP2. Specifically, when the third switch SW3 is turned on, the second terminal of the control capacitor CP may be connected between the first amplifier AP1 and the second amplifier AP2. When the third switch SW3 is turned off, the second terminal of the control capacitor CP may not be connected between the first amplifier AP1 and the second amplifier AP2.

As the operating mode of the reconfigurable amplifier 100 changes, the first through third switches SW1 through SW3 may be controlled as shown in Table 1 below.

TABLE 1

| Mode | SW1 | SW2 | SW3 |
|---|---|---|---|
| Wideband mode | OFF | OFF | OFF |
| Middleband mode | ON | OFF | ON |
| Narrowband mode | ON | ON | OFF |

According to the operation of the first through third switches SW1 through SW3, when the reconfigurable amplifier 100 operates in the wideband mode, the control capacitor CP may not be connected to the gain path.

In addition, when the reconfigurable amplifier 100 operates in the middleband mode, the control capacitor CP may be connected between the first amplifier AP1 and the second amplifier AP2 of the gain path.

In addition, when the reconfigurable amplifier 100 operates in the narrowband mode, the control capacitor CP may be connected between an input terminal and the output terminal of the second amplifier AP2 of the gain path and serve as a Miller capacitor.

Referring back to FIG. 7, the feed forward circuit 120 may include a feed forward path, which receives the input signals INn and INp and performs feed forward compensation on the input signals INn and INp, and the feed forward control circuit 124.

The feed forward control circuit 124 may include a first transistor T1 which is gated by a voltage of a first node VP of the feed forward path, a fourth transistor T4 which is gated by a voltage of a second node VN of the feed forward path, and second and third transistors T2 and T3 which are gated by a voltage of a common mode node CM (or a common feedback loop such as a negative feedback loop of FIG. 14 described below).

Each of the first through fourth transistors T1 through T4 may include a plurality of transistors. In an embodiment of the present disclosure, each of the first through fourth transistors T1 through T4 may consist of a plurality of transistors, but the present disclosure is not limited thereto.

The first transistor T1 gated by the voltage of the first node VP of the feed forward path and the fourth transistor T4 gated by the voltage of the second node VN of the feed forward path may perform feed forward compensation, and the second and third transistors T2 and T3 gated by the voltage of the common mode node CM may function as a common feedback amplifier (CFA). Specifically, the first and fourth transistors T1 and T4 may be connected between an input terminal of the first amplifier AP1 and the output terminal of the second amplifier AP2 as illustrated in FIG. 7 to perform feed forward compensation, and the second and third transistors T2 and T3 may function as the CFA as illustrated in FIG. 7.

Referring to FIG. 9, in an embodiment of the present disclosure, the first transistor T1 included in the feed forward control circuit 124 may consist of four transistors T11 through T14, and the fourth transistor T4 included in the feed forward control circuit 124 may consist of four transistors T41 through T44.

In addition, the second transistor T2 included in the feed forward control circuit 124 may consist of four transistors T21 through T24, and the third transistor T3 included in the feed forward control circuit 124 may consist of four transistors T31 through T34.

While each of the first through fourth transistors T1 through T4 included in the feed forward control circuit 124 consists of four transistors in FIG. 9, the present disclosure is not limited thereto. The number of transistors that constitute each of the first through fourth transistors T1 through T4 included in the feed forward control circuit 124 may be changed.

Switches S1 through S8 may be disposed at respective terminals (e.g., drain terminals) of the transistors T11 through T14, T21 through T24, T31 through T34, and T41 through T44.

Each of the switches S1 through S8 may be controlled as shown in Table 2 below according to the operating mode of the reconfigurable amplifier 100.

TABLE 2

| Mode | S1 | S2 | S3 | S4 | S5 | S6 | S7 | S8 |
|---|---|---|---|---|---|---|---|---|
| Wideband mode | ON | ON | ON | OFF | OFF | OFF | OFF | ON |
| Middleband mode 1 | ON | ON | OFF | OFF | OFF | OFF | ON | ON |
| Middleband mode 2 | ON | OFF | OFF | OFF | OFF | ON | ON | ON |
| Narrowband mode | OFF | OFF | OFF | OFF | ON | ON | ON | ON |

(/Sx (e.g. Sx-bar) indicates a switch that is controlled opposite to Sx. For example, when S1 is ON, /S1 is OFF and vice versa.)

The feed forward control circuit 124 according to an embodiment of the present disclosure may adjust the number of transistors that operate as the CFA of the reconfigurable amplifier 100 by operating as described above. Further, the feed forward control circuit 124 may deactivate the feed forward path of the reconfigurable amplifier 100.

Specifically, while the reconfigurable amplifier 100 operates in the wideband mode or the middleband mode, the feed forward control circuit 124 activates the feed forward path of the reconfigurable amplifier 100 such that feed forward compensation can be performed. In addition, while the reconfigurable amplifier 100 operates in the narrowband mode, the feed forward control circuit 124 deactivates the feed forward path of the reconfigurable amplifier 100 such that feed forward compensation is not performed in the reconfigurable amplifier 100.

The feed forward control circuit 124 may also control a relatively large number of transistors to operate as the CFA when the reconfigurable amplifier 100 operates in the wideband mode and control a relatively small number of transistors to operate as the CFA when the reconfigurable amplifier 100 operates in the middleband mode.

Further, the feedback forward control circuit 124 may change the number of transistors that operate as the CFA as desired when the reconfigurable amplifier 100 operates in the middleband mode.

Of the transistors T11 through T14, T21 through T24, T31 through T34 and T41 through T44 included in the feed forward control circuit 124, the number of transistors that are turned on may always be the same regardless of the operating mode of the reconfigurable amplifier 100. For example, in an embodiment of the present disclosure, eight transistors may always be turned on regardless of the operating mode of the reconfigurable amplifier 100.

The operation of the gain control circuit 114 and the feed forward control circuit 124 are described below.

Figure 10:
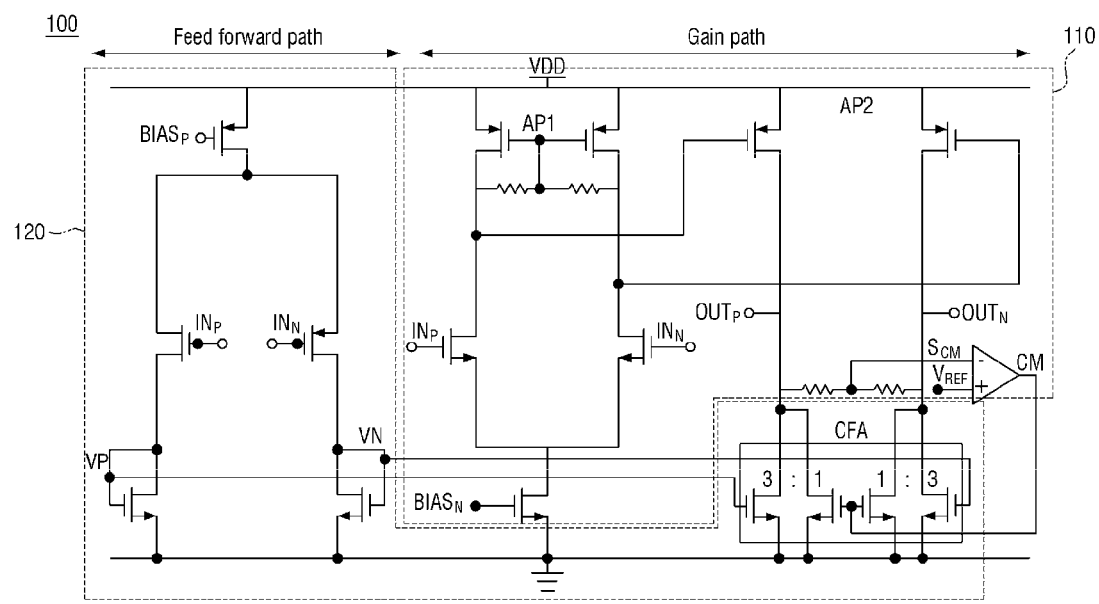
FIGS. 10 through 12 are diagrams illustrating the operation of the reconfigurable amplifier of FIG. 7 in a wideband mode.
Figure 11:
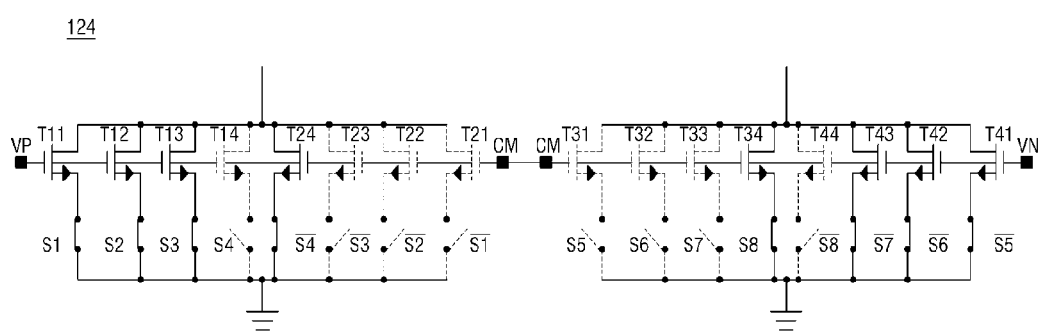
Figure 12:
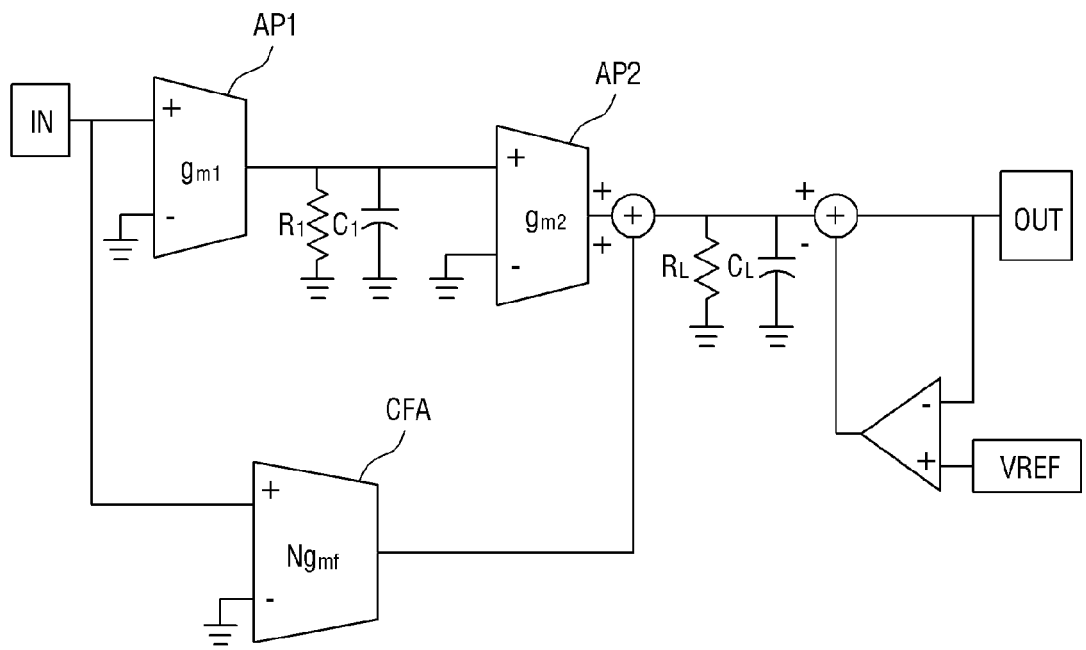

FIGS. 10 through 12 are diagrams illustrating the operation of the reconfigurable amplifier 100 of FIG. 7 in the wideband mode.

FIG. 10 is a circuit diagram of the reconfigurable amplifier 100 operating in the wideband mode. FIG. 11 is a diagram illustrating the operation of the feed forward control circuit 124 when the reconfigurable amplifier 100 operates in the wideband mode. FIG. 12 is a circuit diagram of the reconfigurable amplifier 100 operating in the wideband mode.

Referring to FIG. 8 and Table 1 above, when the reconfigurable amplifier 100 operates in the wideband mode (e.g., when the analog filter 1 of FIG. 6 operates as a wideband filter that passes an input signal having a frequency of 10 MHz or more), all of the first through third switches SW1 through SW3 of the gain control circuit 114 are turned off.

Accordingly, the control capacitor CP is not connected to the gain path of the reconfigurable amplifier 100. Therefore, the gain path of the reconfigurable amplifier 100 does not include the control capacitor CP as illustrated in FIG. 10.

Referring to FIG. 11 and Table 2 above, when the reconfigurable amplifier 100 operates in the wideband mode (e.g., when the analog filter 1 of FIG. 6 operates as a wideband filter that passes an input signal have a frequency of 10 MHz or more), the switches S1 through S8 of the feed forward control circuit 124 are controlled as illustrated in FIG. 11.

Therefore, the feed forward path of the reconfigurable amplifier 100 is activated to perform feed forward compensation. In addition, three activated transistor pairs T11 through T13 and T41 through T43 in the feed forward path of the reconfigurable amplifier 100 operate as a feed forward compensation amplifier illustrated in FIG. 12.

Figure 13:
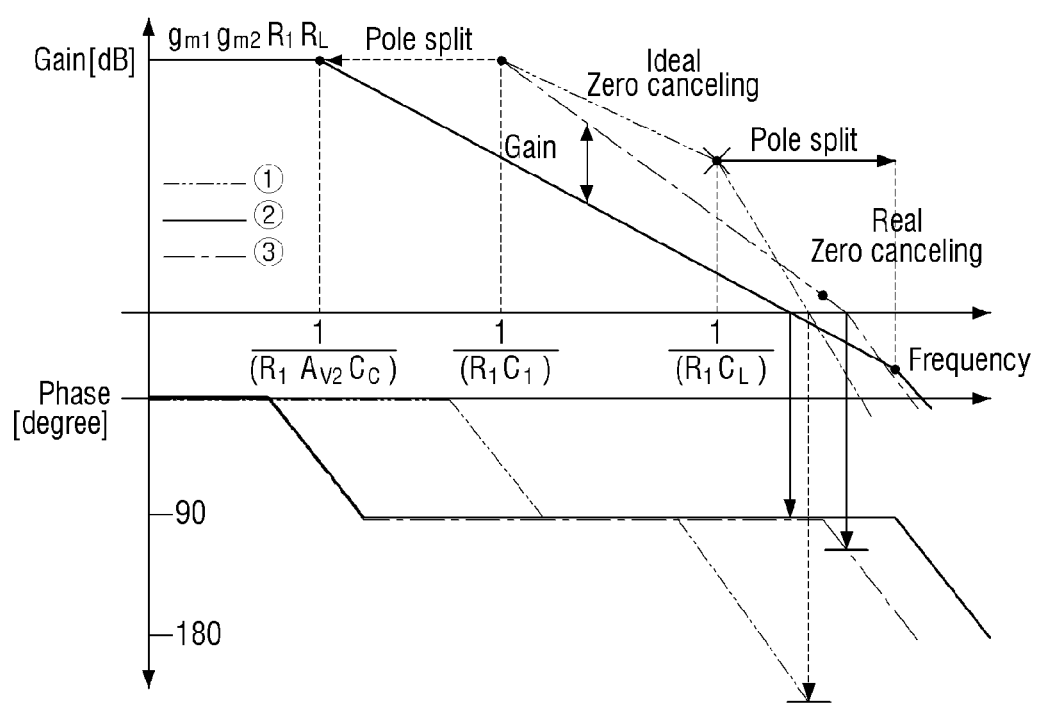
FIG. 13 is a diagram illustrating frequency characteristics of the reconfigurable amplifier of FIG. 7 operating in the wideband mode.

FIG. 13 is a diagram illustrating frequency characteristics of the reconfigurable amplifier 100 of FIG. 7 operating in the wideband mode.

Referring to FIG. 13, a frequency characteristic curve ① of the two-stage amplifier 900a (see FIG. 2) without employing the Miller compensation method and a frequency characteristic curve ② of the Miller compensation two-stage amplifier 900b (see FIG. 4) are compared with a frequency characteristic curve ③ of the reconfigurable amplifier 100 according to an embodiment of the present disclosure.

If the frequency characteristic curve ② of the Miller compensation two-stage amplifier 900b is compared with the frequency characteristic curve ③ of the reconfigurable amplifier 100 the reconfigurable amplifier 100 has a considerably improved gain of a high frequency band, because it performs feed forward compensation in the wideband mode as described above.

Further, if the frequency characteristic curve ① of the two-stage amplifier 900a without employing the Miller compensation method is compared with the frequency characteristic curve ③ of the reconfigurable amplifier 100, the reconfigurable amplifier 100 has better phase characteristics than the two-stage amplifier 900a without employing the Miller compensation method.

FIGS. 14 through 17 are diagrams illustrating the operation of the reconfigurable amplifier 100 of FIG. 7 in the middleband mode.

Figure 14:
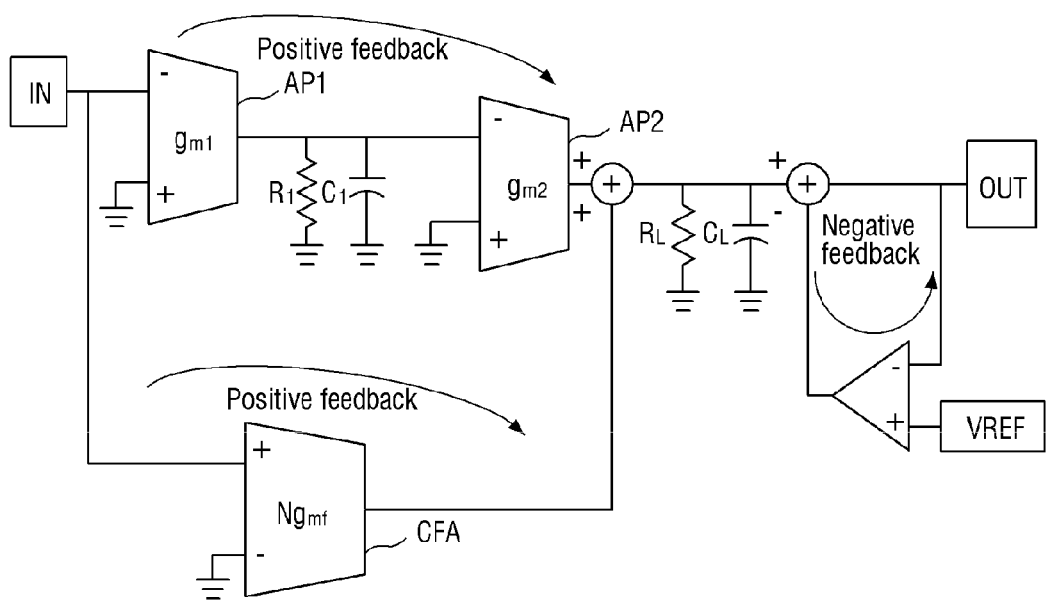
FIGS. 14 through 17 are diagrams illustrating the operation of the reconfigurable amplifier of FIG. 7 in a middle-band mode.

FIG. 14 illustrates a circuit diagram of the reconfigurable amplifier 100 operating in the wideband mode from a common mode perspective.

Referring to FIG. 6, when the reconfigurable amplifier 100 operates in the wideband mode, the resistance levels of the feedback resistors RM of the analog filter 1 are generally low. Therefore, a gain of a positive feedback loop illustrated in FIG. 14 is always lower than that of a negative feedback loop.

However, when the reconfigurable amplifier 100 operates in the middleband mode, the resistance levels of the feedback resistors RM of the analog filter 1 increase. Therefore, if the above-described feed forward compensation is performed without any adjustment, the gain of the positive feedback loop may become higher than that of the negative feedback loop.

In this case, the operation of the reconfigurable amplifier 100 may become unstable. Therefore, when the reconfigurable amplifier 100 operates in the middleband mode, the gain of the negative feedback loop must be reinforced as compared to when the reconfigurable amplifier 100 operates in the wideband mode.

Accordingly, in the reconfigurable amplifier 100 according to an embodiment of the present disclosure, the feed forward control circuit 124 may be adjusted to improve a common mode rejection function for reinforcing the gain of the negative feedback loop. This is described in greater detail below with reference to FIGS. 15 through 17.

Figure 15:
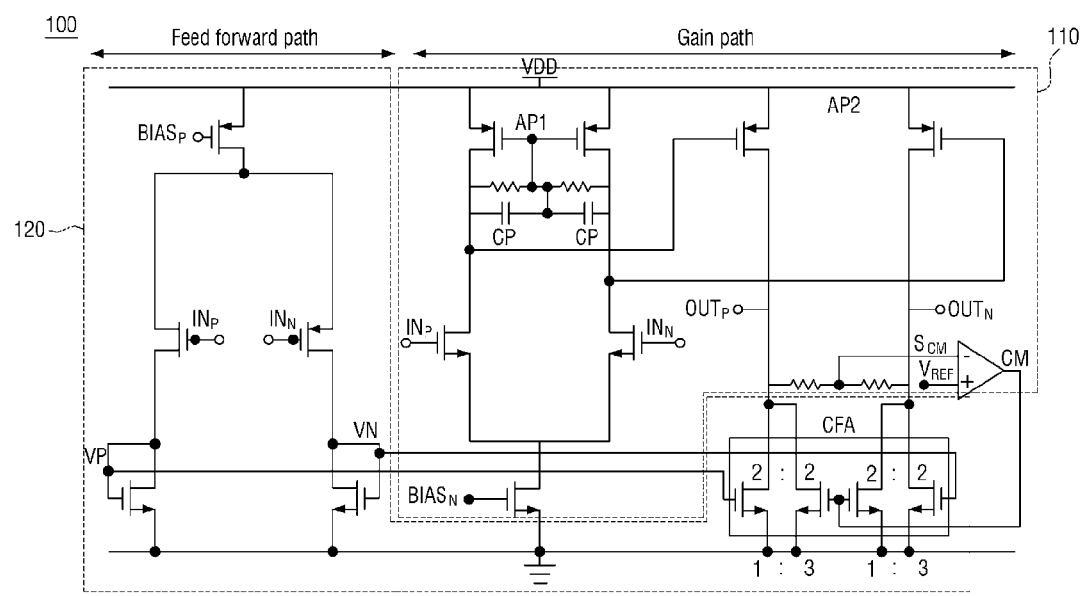
Figure 16:
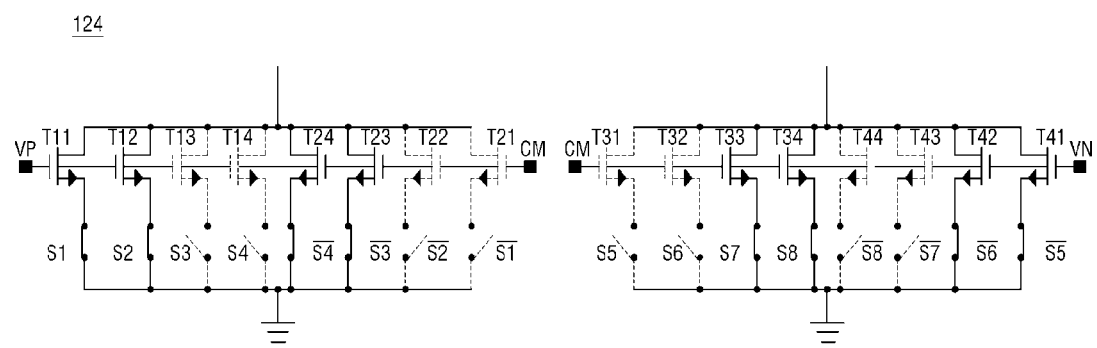
Figure 17:
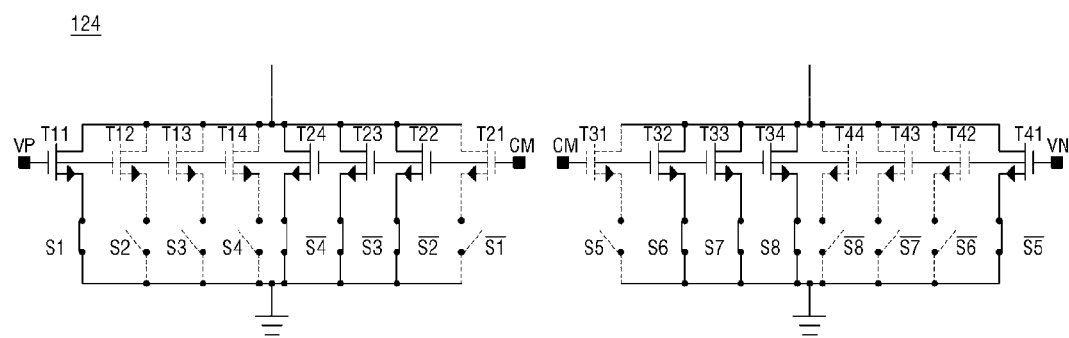

FIG. 15 is a circuit diagram of the reconfigurable amplifier 100 operating in the middleband mode. FIGS. 16 and 17 are diagrams illustrating the operation of the feed forward control circuit 124 when the reconfigurable amplifier 100 operates in the middleband mode.

Referring to FIG. 8 and Table 1 above, when the reconfigurable amplifier 100 operates in the middleband mode (e.g., when the analog filter 1 of FIG. 6 operates as a middleband filter that passes an input signal having a frequency of 2 to 10 MHz), the first and third switches SW1 and SW3 of the gain control circuit 114 are turned on, and the second switch SW2 is turned off.

Figure 18:
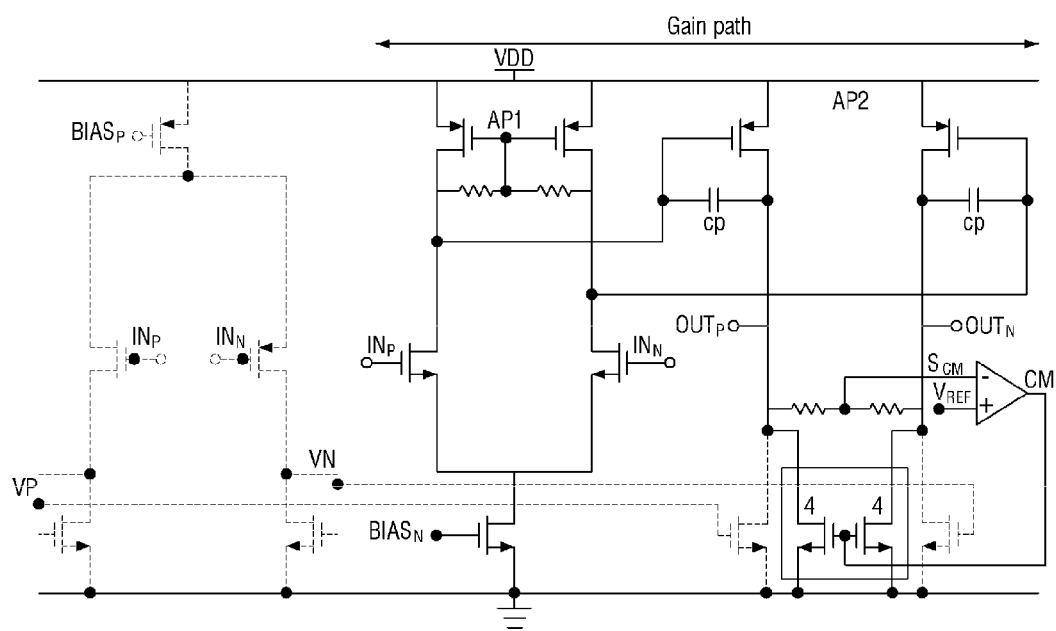
FIGS. 18 and 19 are diagrams illustrating the operation of the reconfigurable amplifier of FIG. 7 in a narrowband mode.

Accordingly, the control capacitor CP may be connected between the first amplifier AP1 and the second amplifier AP2 of the gain path as illustrated in FIGS. 15 and 18.

Referring to FIG. 16 and Table 2 above, when the reconfigurable amplifier 100 operates in a first middleband mode (e.g., when the analog filter 1 of FIG. 6 operates as a middleband filter that passes an input signal having a frequency of 6 to 10 MHz), the switches S1 through S8 of the feed forward control circuit 124 may be controlled as illustrated in FIG. 16.

Therefore, the feed forward path of the reconfigurable amplifier 100 may be activated, and two activated transistor pairs T11 and T12 and T41 and T42 in the feed forward path of the reconfigurable amplifier 100 may perform feed forward compensation. In addition, two transistor pairs T23 and T24 and T33 and T34 are placed in the common feedback loop. Therefore, the common mode rejection function for reinforcing the gain of the negative feedback loop can be improved as compared to when the reconfigurable amplifier 100 operates in the wideband mode as illustrated in FIG. 11.

Referring to FIG. 17 and Table 2 above, when the reconfigurable amplifier 100 operates in a second middleband mode (e.g., when the analog filter 1 of FIG. 6 operates as a middleband filter that passes an input signal having a frequency of 2 to 6 MHz), the switches S1 through S8 of the feed forward control circuit 124 may be controlled as illustrated in FIG. 17.

Therefore, the feed forward path of the reconfigurable amplifier 100 may be activated to perform feed forward compensation. In addition, one activated transistor pair T11 and T41 in the feed forward path of the reconfigurable amplifier 100 may operate as the CFA illustrated in FIG. 15. Further, three transistor pairs T22 through T24 and T32 through T34 are placed in the common feedback loop. Therefore, the common mode rejection function for reinforcing the gain of the negative feedback loop can be improved further.

Figure 19:
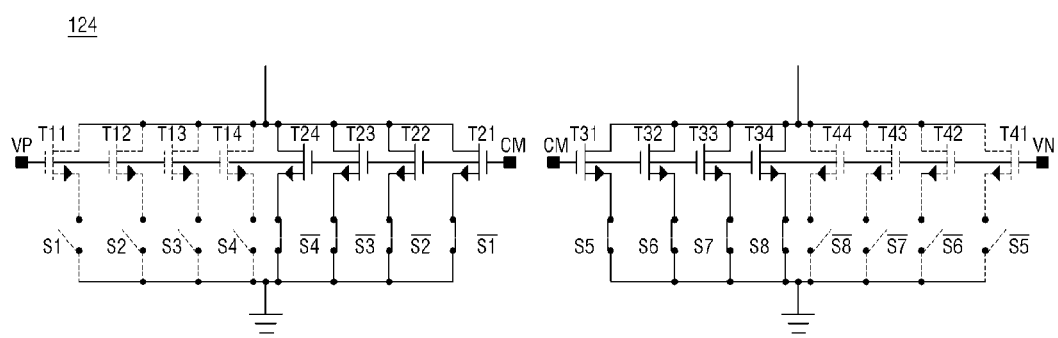

FIGS. 18 and 19 are diagrams illustrating the operation of the reconfigurable amplifier 100 of FIG. 7 in the narrowband mode.

FIG. 18 is a circuit diagram of the reconfigurable amplifier 100 operating in the narrowband mode. FIG. 19 is a diagram illustrating the operation of the feed forward control circuit 124 when the reconfigurable amplifier 100 operates in the narrowband mode.

Referring to FIG. 8 and Table 1 above, when the reconfigurable amplifier 100 operates in the narrowband mode (e.g., when the analog filter 1 of FIG. 6 operates as a narrowband filter that passes an input signal having a frequency of 2 MHz), the first and second switches SW1 and SW2 of the gain control circuit 114 are turned on, and the third switch SW3 is turned off.

Accordingly, the control capacitor CP may be connected between the input terminal and the output terminal of the second amplifier AP2 of the gain path as illustrated in FIG. 19. That is, the control capacitor CP may serve as the Miller capacitor Cc illustrated in FIG. 4. Accordingly, the reconfigurable amplifier 100 may perform Miller compensation.

Referring to FIG. 19 and Table 2 above, when the reconfigurable amplifier 100 operates in the narrowband mode (e.g., when the analog filter 1 of FIG. 6 operates as a narrowband filter that passes an input signal have a frequency of 2 MHz or less), the switches S1 through S8 of the feed forward control circuit 124 may be controlled as illustrated in FIG. 19.

That is, the feed forward path of the reconfigurable amplifier 100 may be deactivated to not perform feed forward compensation.

Since the reconfigurable amplifier 100 according to the current embodiment can apply a different compensation method according to its operating mode, the operational performance and stability of the reconfigurable amplifier 100 can be improved.

Specifically, a feed forward compensation method is applied when the reconfigurable amplifier 100 operates in the wideband mode. Therefore, gain characteristics of the reconfigurable amplifier 100 can be improved.

In addition, a Miller compensation method is applied when the reconfigurable amplifier 100 operates in the narrowband mode. Therefore, the operational stability of the reconfigurable amplifier 100 can be improved.

Furthermore, when the reconfigurable amplifier 100 operates in the middleband mode, the gain of the positive feedback loop and the gain of the negative feedback loop are adaptively adjusted according to the cutoff frequency of the analog filter 1. Therefore, the operational stability of the reconfigurable amplifier 100 can be improved.

Figure 20:
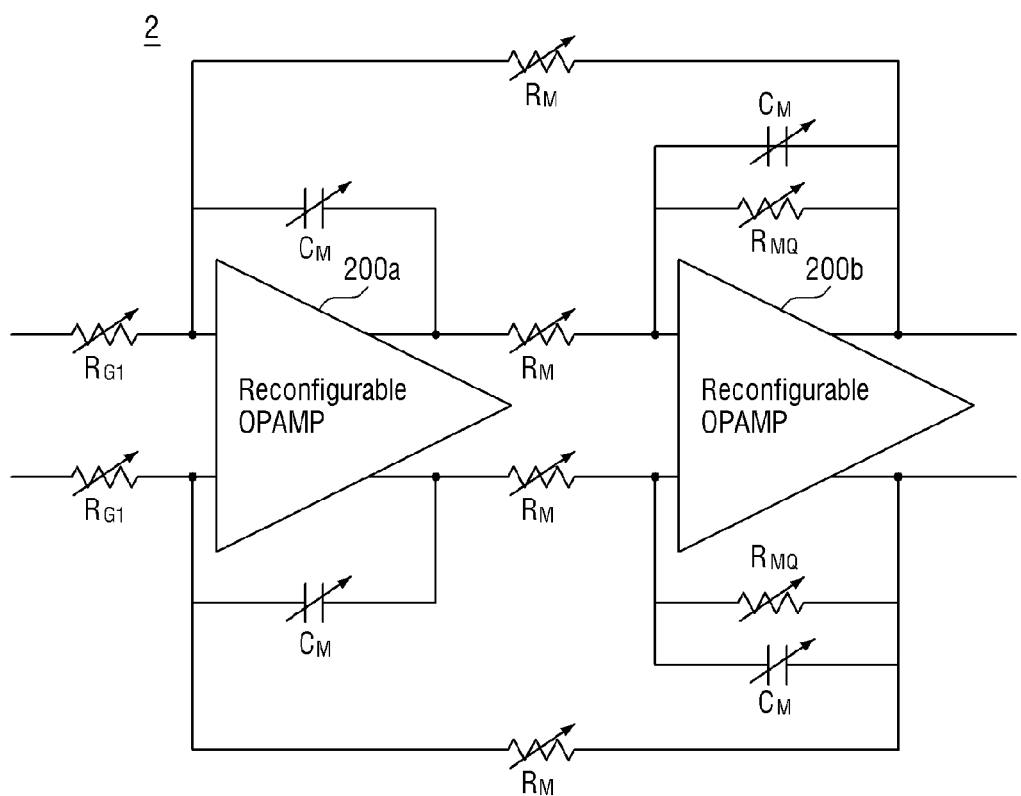
FIG. 20 is a circuit diagram of an analog filter according to an embodiment of the present disclosure.

FIG. 20 is a circuit diagram of an analog filter 2 according to an embodiment of the present disclosure. The embodiments of the present disclosure are described, focusing mainly on differences between other embodiments of the present disclosure.

Referring to FIG. 20, the analog filter 2 may include additional reconfigurable amplifiers as compared with the analog filter 1 (see FIG. 6) described above.

Specifically, the analog filter 2 may be a two-stage filter including a first reconfigurable amplifier 200a and a second reconfigurable amplifier 200b.

Each of the first and second reconfigurable amplifiers 200a and 200b may employ substantially the same configuration as the reconfigurable amplifier 100 (see FIG. 6) described above.

Each of input resistors RG1 and feedback resistors RM and RMQ may include, for example, a variable resistor. A gain and cutoff frequency of the analog filter 2 may be changed by varying resistance levels of the input resistors RG1 and the feedback resistors RM and RMQ.

The feedback resistors RM and RMQ and feedback capacitors CM may be controlled by, e.g., a digital code to increase or decrease linearly or exponentially.

While the present disclosure has been shown and described with reference to embodiments thereof, it will be understood by those of ordinary skill in the art that various changes in form and details may be made therein without departing from the scope and spirit of the present disclosure as defined by the appended claims and their equivalents.

What is claimed is:

1. A reconfigurable amplifier, comprising:
    a gain circuit comprising a gain path configured to amplify an input signal; and
    a feed forward circuit comprising a feed forward path configured to receive the input signal and perform feed forward compensation on the input signal,
    and a first control circuit configured to perform the feed forward compensation in a first mode by activating the feed forward path, and deactivate the feed forward path in a second mode different from the first mode, wherein the first control circuit comprises a plurality of first transistors gated by the feed forward path and a plurality of second transistors gated by a common feedback loop.

2. The reconfigurable amplifier of claim 1, wherein the gain circuit further comprises a first amplifier configured to amplify the input signal and a second amplifier configured to further amplify the amplified input signal.

3. The reconfigurable amplifier of claim 1, wherein the first control circuit is further configured to perform the feed forward compensation in a third mode different from the first and second modes by activating the feed forward path and perform the feed forward compensation in the first mode and the third mode using different numbers of transistors.

4. The reconfigurable amplifier of claim 1, wherein a sum of the plurality of first transistors configured to be turned on and the second transistors configured to be turned on is constant regardless of the first or second mode.

5. The reconfigurable amplifier of claim 1, wherein m of the plurality of first transistors are turned on in the first mode, and n of the plurality of first transistors are turned on in the second mode, wherein m is an integer greater than or equal to one, and n is an integer greater than or equal to zero and less than m.

6. The reconfigurable amplifier of claim 1, wherein the gain circuit further comprises a second control circuit configured to control the gain path to have different capacitance configurations in the first mode and the second mode, wherein the capacitance configurations indicate which element of the second control circuit connects to a capacitance.

7. The reconfigurable amplifier of claim 6, wherein the second control circuit is configured to control the gain path to have a different capacitance configuration in a third mode, which is different from the first and second modes, from the capacitance configurations in the first and second modes.

8. A reconfigurable amplifier, comprising:
    a gain circuit comprising a first amplifier configured to amplify an input signal and a second amplifier configured to amplify an output of the first amplifier;
    a feed forward circuit connected to an input terminal of the first amplifier and an output terminal of the second amplifier and configured to perform feed forward compensation;
    a common feedback amplifier; and a control circuit configured to control the gain circuit to have a first capacitance configuration in a first mode and control the gain circuit to have a second capacitance configuration, which is different from the first capacitance configuration, in a second mode different from the first mode, wherein the capacitance configurations indicate which element of the second control circuit connects to a capacitance.

9. The reconfigurable amplifier of claim 8, wherein the control circuit comprises a capacitor having a first terminal connected to an input terminal of the second amplifier, and having a second terminal of the capacitor that is not connected to the output terminal of the second amplifier in the first mode but is connected to the output terminal of the second amplifier in the second mode.

10. The reconfigurable amplifier of claim 8, wherein the control circuit comprises a switch having a first terminal connected to the input terminal of the second amplifier and a second terminal connected to a capacitor, wherein the switch is configured to be turned off in the first mode and turned on in the second mode.

11. The reconfigurable amplifier of claim 8, wherein the control circuit is further configured to control the gain circuit to have a third capacitance configuration, which is different from the first and second capacitance configurations, in a third mode different from the first and second modes.

12. The reconfigurable amplifier of claim 11, wherein the control circuit comprises:
a first switch configured to be turned off in the first mode and turned on in the second and third modes;
a capacitor connected in series with the first switch;
a second switch configured to be turned off in the first and third modes and turned on in the second mode to connect the capacitor between the input terminal and the output terminal of the second amplifier; and
a third switch configured to be turned off in the first and second modes and turned on in the third mode to connect the capacitor between an output terminal of the first amplifier and the input terminal of the second amplifier.

13. A reconfigurable amplifier, comprising:
a gain circuit comprising a first amplifier configured to amplify an input signal and a second amplifier configured to amplify an output of the first amplifier; and
a feed forward circuit and a control circuit connected to an input terminal of the first amplifier and an output terminal of the second amplifier and configured to perform feed forward compensation,
wherein the control circuit is further configured to perform feed forward compensation in a first mode using m first transistors and perform feed forward compensation in a second mode different from the first mode using n first transistors, wherein m is an integer greater than or equal to one, and n is an integer greater than or equal to zero and less than m.

14. The reconfigurable amplifier of claim 13, wherein the first mode is a mode in which an input signal having a first frequency is passed and an input signal having a second frequency less than the first frequency is filtered, and the second mode is a mode in which the input signal having the second frequency is passed and the input signal having the first frequency is filtered.

15. The reconfigurable amplifier of claim 13, wherein m is a natural number, and n is zero in the second mode.

16. The reconfigurable amplifier of claim 13, wherein the control circuit further comprises k second transistors gated by a voltage level of a first node and connected in parallel to each other, and the n first transistors are gated by a voltage level of a second node different from the first node and connected in parallel to each other, wherein k is an integer greater than or equal to zero.

* * * * *